(12) United States Patent
Eickelmann et al.

(10) Patent No.: US 10,597,772 B2
(45) Date of Patent: *Mar. 24, 2020

(54) FUNCTIONALLY GRADED MATERIAL BY IN-SITU GRADIENT ALLOY SPUTTER DEPOSITION MANAGEMENT

(71) Applicant: International Business Machines Corporation, Armonk, NY (US)

(72) Inventors: Hans-Juergen Eickelmann, Mainz (DE); Thorsten Muehge, Mainz (DE); Erik Rueger, Mainz (DE); Markus Schmidt, Mainz (DE)

(73) Assignee: International Business Machines Corporation, Armonk, NY (US)

( * ) Notice: Subject to any disclaimer, the term of this patent is extended or adjusted under 35 U.S.C. 154(b) by 10 days.

This patent is subject to a terminal disclaimer.

(21) Appl. No.: 15/907,838

(22) Filed: Feb. 28, 2018

(65) Prior Publication Data

US 2018/0187301 A1      Jul. 5, 2018

Related U.S. Application Data

(63) Continuation of application No. 14/706,032, filed on May 7, 2015, now Pat. No. 9,963,778.

(51) Int. Cl.
| | |
|---|---|
| *C23C 14/34* | (2006.01) |
| *C23C 14/54* | (2006.01) |
| *C23C 14/02* | (2006.01) |
| *H01J 37/32* | (2006.01) |
| *H01J 37/34* | (2006.01) |

(52) U.S. Cl.
CPC ........ *C23C 14/3464* (2013.01); *C23C 14/027* (2013.01); *C23C 14/3407* (2013.01); *C23C 14/3492* (2013.01); *C23C 14/54* (2013.01); *C23C 14/542* (2013.01); *C23C 14/545* (2013.01); *C23C 14/548* (2013.01); *H01J 37/32935* (2013.01); *H01J 37/3429* (2013.01); *H01J 37/3473* (2013.01)

(58) Field of Classification Search
CPC .................. C23C 14/3492; H01J 37/3429
See application file for complete search history.

(56) References Cited

U.S. PATENT DOCUMENTS

| | | | |
|---|---|---|---|
| 4,626,336 A | 12/1986 | Bloomquist et al. | |
| 4,834,855 A * | 5/1989 | Bloomquist | ........ C23C 14/3407 204/192.12 |
| 7,563,725 B2 | 7/2009 | Morad | |
| 7,897,416 B2 | 3/2011 | Basol et al. | |
| 9,963,778 B2 * | 5/2018 | Eickelmann | .......... C23C 14/027 |

(Continued)

OTHER PUBLICATIONS

U.S. Appl. No. 14/706,032, filed May 5, 2015, 2016/0326631.
List of IBM Patents or Applications Treated as Related, Feb. 2018.

*Primary Examiner* — Jason Berman
(74) *Attorney, Agent, or Firm* — Lieberman & Brandsdorfer, LLC

(57) ABSTRACT

Embodiments relate to a sputter chamber with a configurable surface in communication with a target material. A control system is in communication with the chamber and functions to prepare an alloy film by changing a composition of the configurable surface. As ingress gas is introduced to the chamber to interact with the changed composition, the interaction causes a reaction that produces an alloy film.

20 Claims, 7 Drawing Sheets

(56) References Cited

U.S. PATENT DOCUMENTS

2006/0188660 A1     8/2006   Teer
2014/0193939 A1*   7/2014   Teng .................. H01L 31/0322
                                                                                                438/61

\* cited by examiner

FUNCTIONALLY GRADED MATERIAL BY IN-SITU GRADIENT ALLOY SPUTTER DEPOSITION MANAGEMENT

CROSS REFERENCE TO RELATED APPLICATION(S)

This application is a continuation patent application claiming the benefit of the filing date of U.S. patent application Ser. No. 14/706,032 filed on May 7, 2015 and titled "Functionally Graded Material By In-Situ Gradient Alloy Sputter Deposition Management" now pending.

BACKGROUND

The present application relates to preparing an alloy film in a sputter chamber. More specifically, the application relates to preparing the alloy film with a vertically variable and flexible alloy composition.

In many cases, a property of a material can be altered significantly by changing the properties of its surface. In other cases, providing a material composition gradient can provide improved functionality. Examples include the hardening of a metal surface by introducing a gradual composition change of metallic towards ceramic properties to improve mechanical properties, such as abrasion resistance, impact strength, etc., or buffer layers in between two distinct materials to improve adhesion or to provide specific electronic functionality as well as material gradients to provide anti-reflective properties in optical coating technology. Other examples include the formation of bandgap gradients in thin film alloy semiconductor films.

In current conventional practice, thin film manufacturing and semiconductor manufacturing techniques are limited. One such technique employs a sputter chamber to deposit a thin film on a substrate by sputtering a block of source material onto the substrate. Sputter deposition typically takes place in a vacuum using a sputter gas, such as Argon. Sputtered atoms ejected into the gas phase are not in their thermodynamic equilibrium state, and tend to deposit on all surfaces of the vacuum chamber. A substrate placed in the chamber will be coated with a thin film of the source material. Sputtering takes place with argon gas plasma, or another inert gas in a plasma state, as well as a target material, such as a semi conductive material, a metallic material, or a buffer material.

SUMMARY

The embodiments include a computer implemented method and system for preparing an alloy film via sputter deposition technology.

In one aspect, the computer implemented method and is provided for optimization of a gradient alloy deposition by using a flexible composition sputter target, and more specifically, for production of an alloy film. Program code is provided to communicate with a sputter chamber having a configurable surface provided in communication with a target material. The configurable surface includes a moveable segment. Program code is provided to flexibly change a composition of the configurable surface, which includes selective introduction of the segment. In addition, program code is provided to introduce ingress gas to the chamber to interact with the changed composition. An alloy film is produced from the interaction.

In another aspect, a computer system is provided with a processing unit operatively coupled to memory. A sputter chamber is provided in communication with the processing unit. The sputter chamber has a configurable surface in communication with a target material. The configurable surface includes a moveable segment. A control system is provided in communication with the sputter chamber, and functions to prepare an alloy film. More specifically, the control system changes a composition of the configurable surface, including selective introduction of the segment. Ingress gas is introduced to the chamber to interact with the changed composition. An alloy film is produced from the interaction.

These and other features and advantages will become apparent from the following detailed description of the presently preferred embodiment(s), taken in conjunction with the accompanying drawings.

BRIEF DESCRIPTION OF THE SEVERAL VIEWS OF THE DRAWINGS

The drawings referenced herein form a part of the specification. Features shown in the drawings are meant as illustrative of only some embodiments, and not of all embodiments unless otherwise explicitly indicated.

DETAILED DESCRIPTION

It will be readily understood that the components, as generally described and illustrated in the Figures herein, may be arranged and designed in a wide variety of different configurations. Thus, the following detailed description of the embodiments of the apparatus, system, method, and computer implemented method, as presented in the Figures, is not intended to limit the scope, as claimed, but is merely representative of selected embodiments.

Reference throughout this specification to "a select embodiment," "one embodiment," or "an embodiment" means that a particular feature, structure, or characteristic described in connection with the embodiment is included in at least one embodiment. Thus, appearances of the phrases "a select embodiment," "in one embodiment," or "in an embodiment" in various places throughout this specification are not necessarily referring to the same embodiment.

The illustrated embodiments will be best understood by reference to the drawings, wherein like parts are designated by like numerals throughout. The following description is intended only by way of example, and simply illustrates certain selected embodiments of devices, systems, and processes that are consistent with the embodiments as claimed herein.

Figure 1:
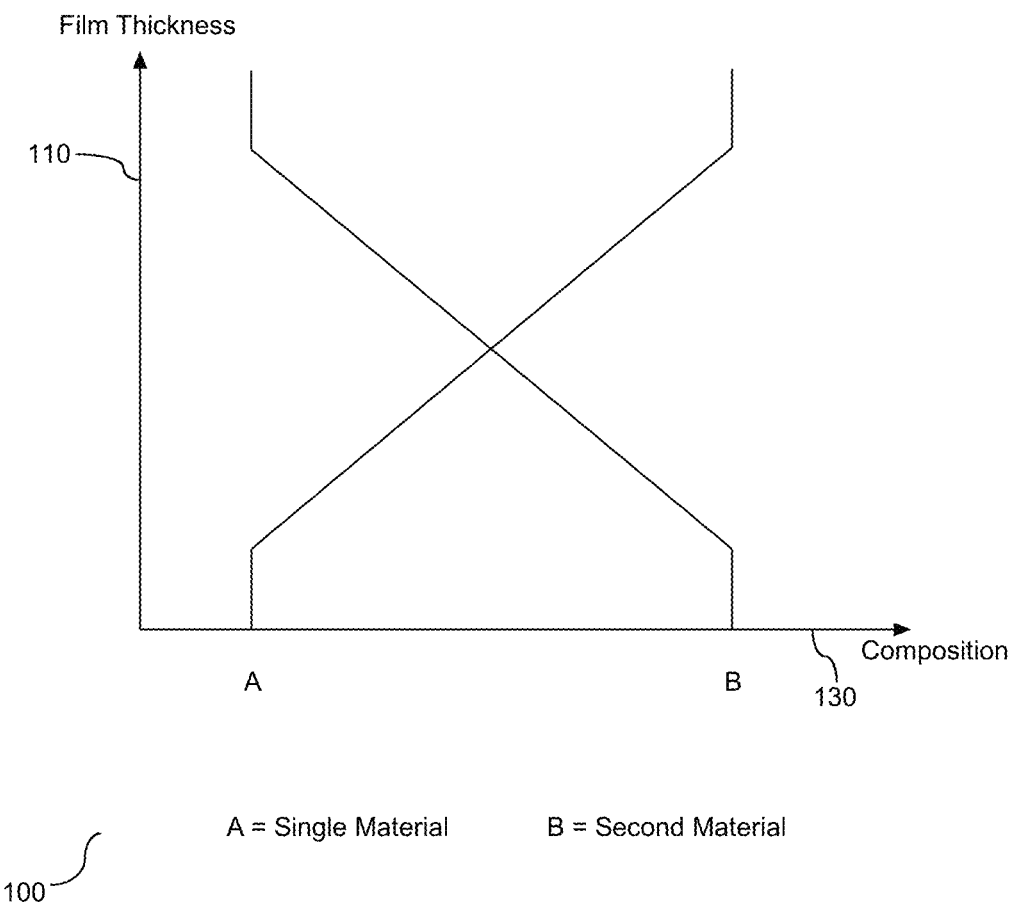
FIG. 1 depicts a block diagram illustrating a graph of the material composition.

With reference to FIG. 1, a block diagram (100) is provided illustrating a graph of a material composition. The materials shown and described herein should not be considered limiting. The graph is shown with two axes (110) and (130), referred to herein as a vertical axis and a horizontal axis, respectively. The vertical axis (110) represents the film thickness, and the variant of the thickness. The horizontal axis (130) represents the material composition and more specifically, the variations in the composition across the thickness of the material. The variable X represents the variant over the film thickness. As shown, the composition of the material changes based on the variation of secondary material(s) versus the variation of the first material(s). The first material(s) and the second material(s) can be an alloy material, or a ceramic material. Accordingly, this graph demonstrates a vertically variable and flexible material composition.

Figure 2:
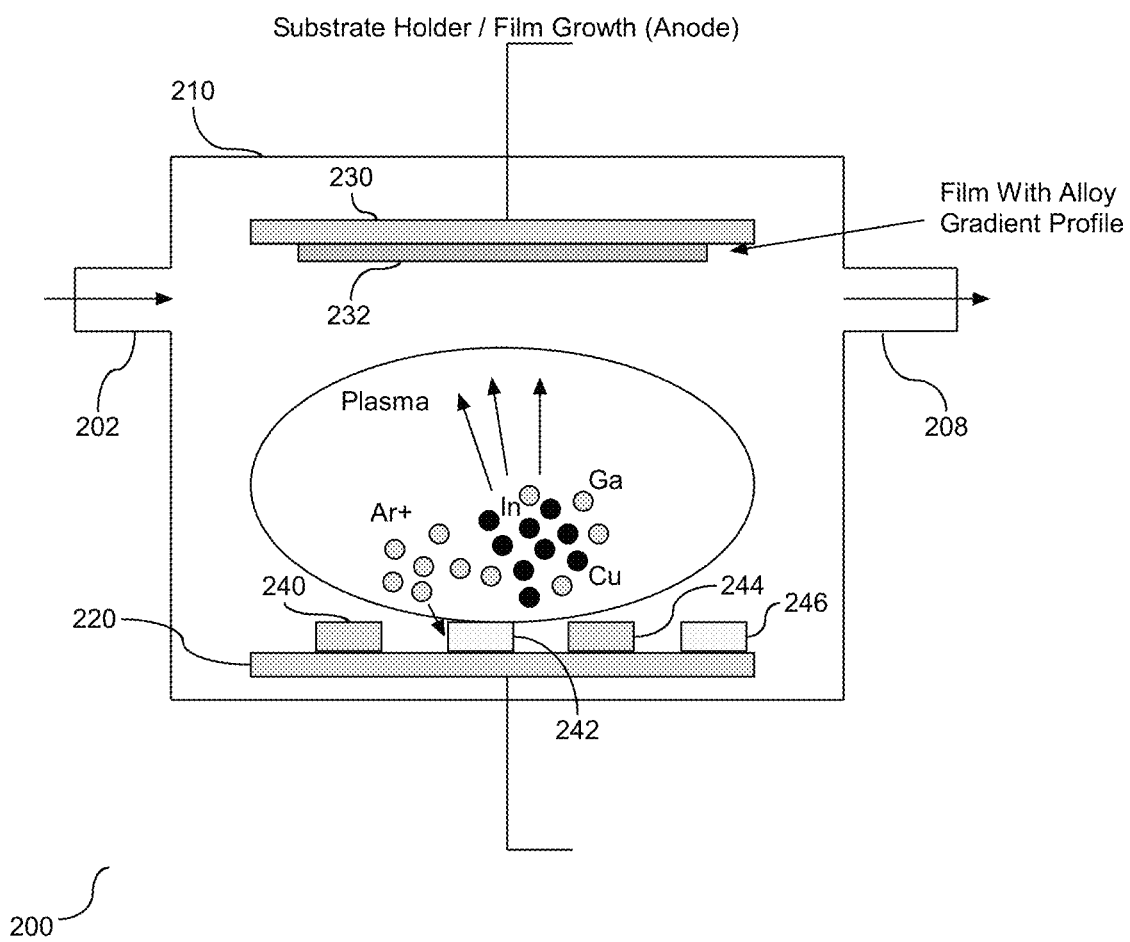
FIG. 2 depicts a block diagram illustrating a sputter chamber employed for deposition of material on a substrate.

There are multiple embodiments associated with the alloy film, including a method of manufacture, a control system to facilitate and enable the manufacture, and a resulting flexible and vertical alloy gradient. Referring to FIG. 2, a block diagram (200) is provided illustrating a sputter chamber employed for deposition of material on an anode substrate, also known as a sputter process. As shown, the chamber (210) includes an ingress (202) and an egress (208). The ingress (202) is employed for the introduction of a sputtering gas into the chamber (210), and the egress (208) is employed for the exit of the gas following the reaction in the chamber (210). In one embodiment, a vacuum pump is employed with the egress (208). A source material (220) in the form of a substrate is shown within an interior of the chamber (210). The source material (220) is referred to as the target. As the sputter gas, which in one embodiment is Argon gas, interacts with the source material (220), a film (232) deposits onto an anode substrate (230). More specifically, the Argon gas interacts with the source material (220) and particles from the source material (220) are released and attracted to the substrate (230) to form the film (232).

Ionic deposition through sputtering pertains to the flow of electrons from a negatively charged target source material in a plasma environment, colliding with Argon gas atoms, and driving these electrons off due to their like charge. These inert gas atoms become positively charged ions attracted to the negatively charged target material, also referred to as a cathode, at a very high velocity that "sputters off" atomic size particles from the target source material (cathode) due to the momentum of the collisions. These particles cross the vacuum chamber and are deposited as a thin film of material on the surface of the substrate to be coated, also referred to as the anode.

The source material (220) is shown with a plurality of secondary materials (240), (242), (244), and (246). In one embodiment, and as shown herein, the secondary materials are sequentially layered on the source material (220). The different layout and application of the layers of the secondary material will change the reaction with the source material (220) thereby changing the composition of the film (232). Accordingly, modification of the introduction of different forms of the source material in the chamber produces the vertical gradient of the film.

Figure 3:
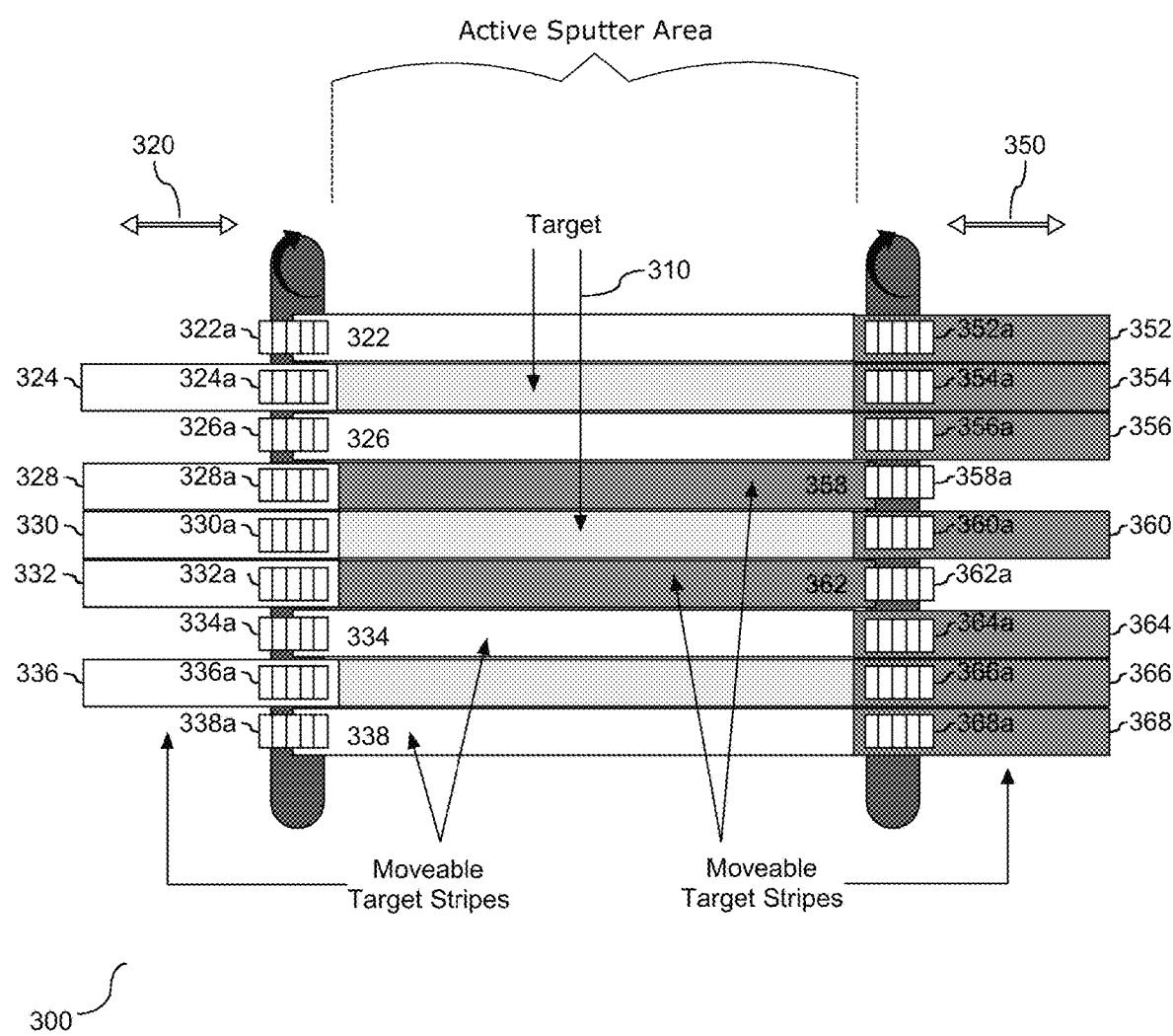
FIG. 3 depicts a block diagram illustrating a top view of a system for applying the layers of secondary material to the sputter target.

Referring to FIG. 3, a block diagram (300) is provided illustrating a top view of a system for applying the layers of secondary material to the sputter target, or source, also referred to herein as the target. As shown, the target is comprised of a material (310). Two secondary materials are shown and described. Each of these secondary materials is introduced into the sputter chamber as a contained layer to be applied to the target. As shown herein, the secondary materials are applied as one or more layers across the target forming a pattern. In one embodiment, a control system may be employed to vary the pattern of secondary material(s) with respect to the sputter target, including variation of the time in which one or more of the secondary materials are introduced as a layer to the target.

The application of the secondary material layers to the target is not static. More specifically, the layers and the application of the layers may change over time. Introduction of each individual layer to the chamber, and more specifically to communication with the target is controlled. The layers and associated control of introduction of the layers changes the in situ coverage of the target by the secondary material. In the example shown, the secondary material may be selectively moved in and out of the chamber. There are two external areas shown, including a first external area (320) and a second external area (350). The first external area (320) is shown housing secondary material. The second external area (350) is shown housing secondary material, which in one embodiment is different from the secondary material of the first external area. In one embodiment, the materials in the defined external areas may be switched, or in one embodiment, an alternative secondary material may be employed. In the example shown here, the secondary material is provided in segments, with an addressable control mechanism configured to selectively deliver the individual segments to the target (310). More specifically the target (310) has a defined and static surface area. The segments of secondary material (320) may be selectively delivered to communicate with selective areas of the target (310) or the entire area of the target (310). Similarly, the segments of secondary material (350) may be selectively delivered to communicate with selective areas of the target (310) or the entire area of the target (310).

In the example shown herein, each secondary material is divided into nine segments, although this quantity should not be considered limiting. More specifically, secondary material (320) includes segments (322), (324), (326), (328), (330), (332), (334), (336), and (338), and secondary material (350) includes segments (352), (354), (356), (358), (360), (362), (364), (366), and (368). In one embodiment, each segment has a separate control mechanism, as follows: segment (322) with control (322a), segment (324) with control (324a), segment (326) with control (326a), segment (328) with control (328a), segment (330) with control (330a), segment (332) with control (332a), segment (334) with control (334a), segment (336) with control (336a), segment (338) with control (338a), segment (352) with control (352a), segment (354) with control (354a), segment (356) with control (356a), segment (358) with control (358a), segment (360) with control (360a), segment (362) with control (362a), segment (364) with control (364a), segment (366) with control (366a), and segment (368) with control (368a). Furthermore, as shown herein each secondary material segment is shown having a uniform width. In one embodiment, the widths may be non-uniform. The control mechanisms control the separate delivery of select segments to the target (310). In one embodiment, the control mechanism is a wheel, although the specific embodiment should not be considered limiting. Furthermore, in one embodiment, the control mechanism(s) is insulated so as not to interfere with the reaction in the chamber. As the control mechanism delivers one or more segments to the target (310) or removes segments from the target (310), the surface area of the target changes. More specifically, the composition of the material deposited on the target (310) is changed.

The sputter gas delivered to the chamber interacts with the composition of the target. As the composition changes, the interaction of the sputter gas to the composition changes, thereby changing the alloy condensing on an anode surface of the substrate in the chamber and providing the alloy film. Accordingly, the composition of the alloy film changes based on the in situ coverage change of the target (310) by one or more segments of secondary material.

Figure 4:
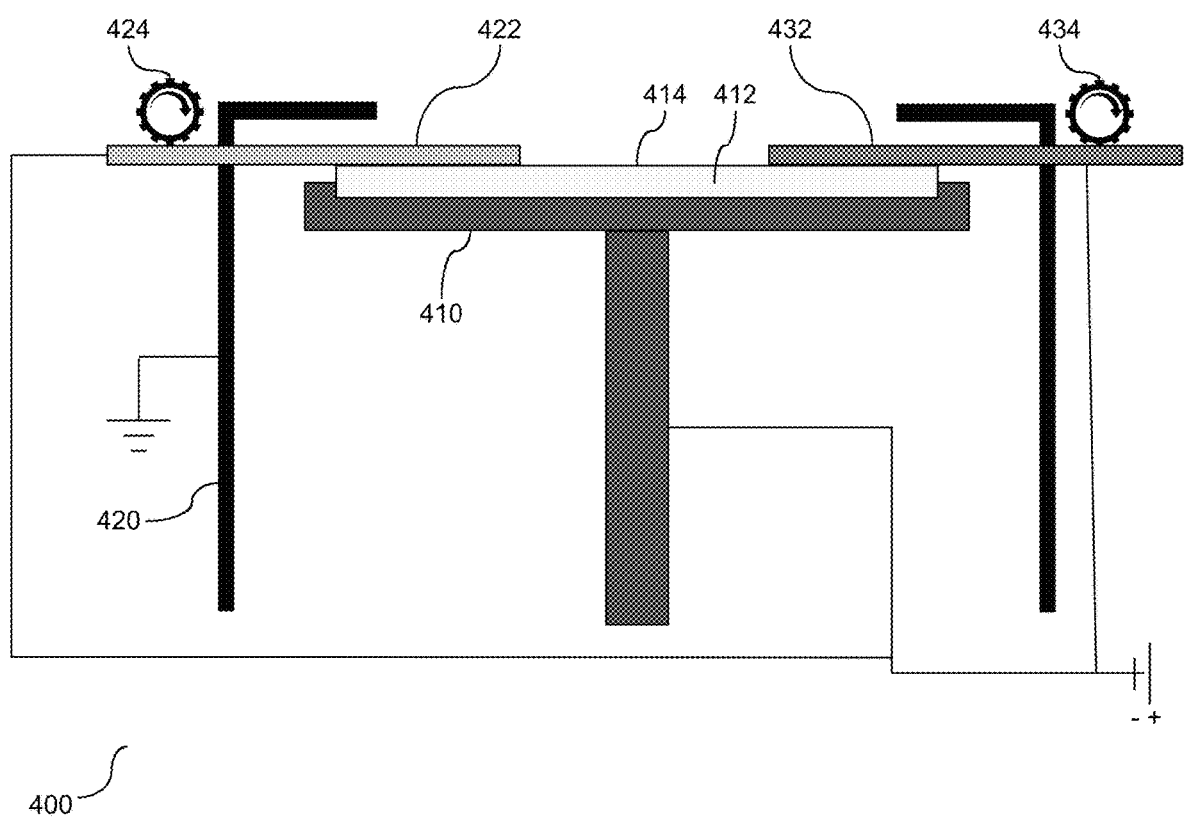
FIG. 4 depicts a side view of the secondary material delivery system to the sputter chamber.

Referring to FIG. 4, a side view (400) of the secondary material delivery system to the sputter chamber is provided. The view is limited to the target and the delivery of secondary materials, and does not include an in depth illustration of the sputter chamber. The cathode target (410) is shown in communication with a base (412) to hold the associated cathode in a fixed or stationary position. In one embodiment, the base (412) is water cooled. A closure (420) is provided to shield the target base (412) from active plasma. Secondary materials are shown on opposite sides of the target (410). The target (410) is shown with a first secondary material (422), and a second secondary material (432). Each of the secondary materials (422) and (432) are delivered to a top surface (414) of the cathode target (410). Each of the secondary materials is introduced to the target (410) through an associated delivery device. More specifically, material (422) is in communication with delivery device (424) and material (432) is in communication with delivery device (434). In one embodiment, each of the delivery devices is insulated. Accordingly, secondary material is selectively delivered to the target via the associated delivery devices (424) and (434), thereby changing the composition of the target, which in turn changes the composition of the alloy film produced from interaction of the sputter gas with the target composition.

As shown and described in FIGS. 1-4, the vertical gradient of the alloy film is optimized by modifying the in-situ coverage of the target by a secondary material. In one embodiment, the delivery and removal of the secondary material with respect to the sputter chamber is based on a desired gradient film. More specifically, the coverage is modified in-situ over the course of time based on an estimated composition of the alloy film that is produced. The following formula represents the total sputter rate, R:

$$R = R(\text{base material}) * A(\text{base material})/A(\text{Total}) + R(\text{first material}) * A(\text{first material})/A(\text{Total}) + R(\text{second material}) * A(\text{second material})/A(\text{Total}),$$

where R is the individual sputter rate of the associated material, A (Total) is the complete surface area of the active sputter area of the target. More specifically, R (base material) is the sputter rate of the base material, R (first material) is the sputter rate of the first material, and R (second material) is the sputter rate of the second material. In one embodiment, the sputter rates of the materials are fixed. Accordingly, the sputter rate, R, is based on the percentage of exposed material in the sputter chamber, including the percentage of the base material and each introduced secondary material and the individual sputter rates of each of the introduced secondary materials.

Figure 5:
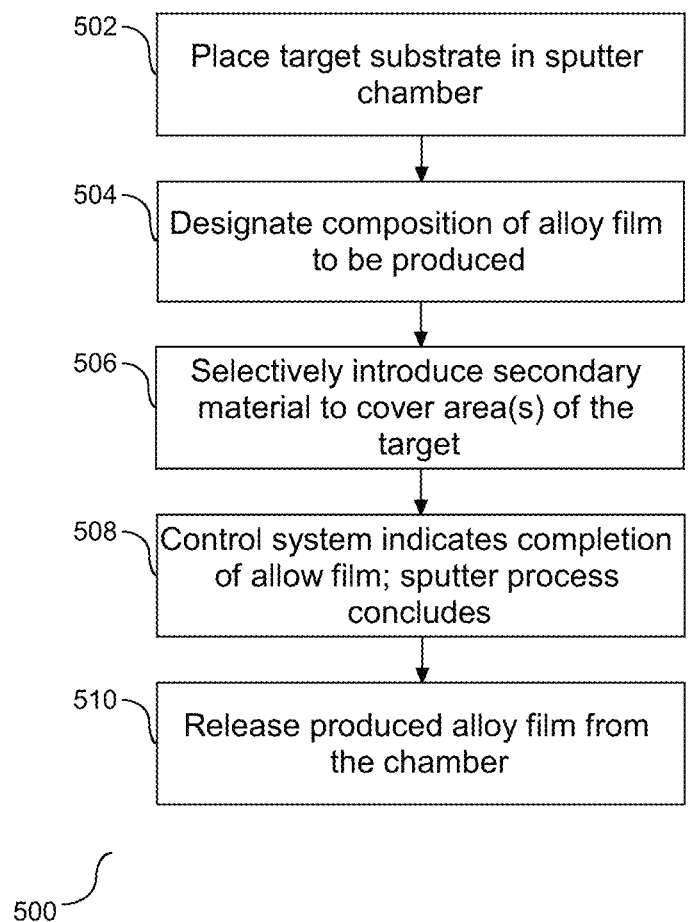
FIG. 5 depicts a flow chart illustrating a process for preparing the alloy film.

The process(es) shown herein demonstrate an in-situ process for modification of the alloy film deposited on the anode substrate via the sputter process. Referring to FIG. 5, a flow chart (500) is provided illustrating a process for preparing the alloy film. A target substrate is placed in a sputter chamber (502). In one embodiment, the target substrate is comprised of copper material. A composition of an alloy film to be produced via the sputter chamber is designated (504). Based on the composition, secondary material selectively covers the target (414), and specifically, introduced to selectively cover areas of the target (506). In one embodiment, the secondary material is in the form of Gallium and Indium. Similarly, in one embodiment, additional or alternative secondary materials may be employed. In one embodiment, a control system manages the delivery of the secondary material(s), including managing the quantity and timing of the delivery. For example, as shown and described above, each unit of the secondary material has an associated control mechanism. In the case of a control system, each control mechanism is addressable, and communication with each control mechanism is established via the associated address. The control system effectively manages and controls the selective introduction of the secondary material(s) as a percentage of surface coverage of the target surface. In one embodiment, a gradient of the alloy film is flexible, and the gradient is changed based on a composition of the introduced secondary material(s). The control system is responsive to the changes in the gradient, and selectively communicates with each addressed control mechanism to manage selective delivery of the secondary material so that the area of the target is effectively managed during the sputter process. As sputter gas interacts with the cathode target, the metal alloy forms on the anode substrate. In one embodiment, the cathode target and associated secondary materials are dynamically replenished based on the film formed on the anode substrate and more specifically to address any requirements for the film.

The sputter process is associated with depositing film on the anode substrate. At the same time, the sputter process described herein pertains to selectively modifying the composition of the target, which directly or indirectly modifies the composition of the film deposited on the anode substrate. More specifically, an associated process of delivery of the secondary materials to the target substrate may change over time. The delivery process may be separated into multiple time segments, with the control system to selectively deliver different quantities of the secondary material during one or more of the time segments. In one embodiment, the secondary materials are in the form of separate materials, including a first material and a second material. Similarly, in one embodiment, the composition of the alloy film on the anode substrate may be estimated from the individual sputter rates of the target surface, and any secondary materials introduced and in communication with the target substrate during the sputter process. When the control system has indicated completion of the alloy film, the sputtering process ceases (508), and the alloy film produced via the sputtering process is released from the chamber (510). Accordingly, the delivery of the secondary material is activated and managed via the control system.

Figure 6:
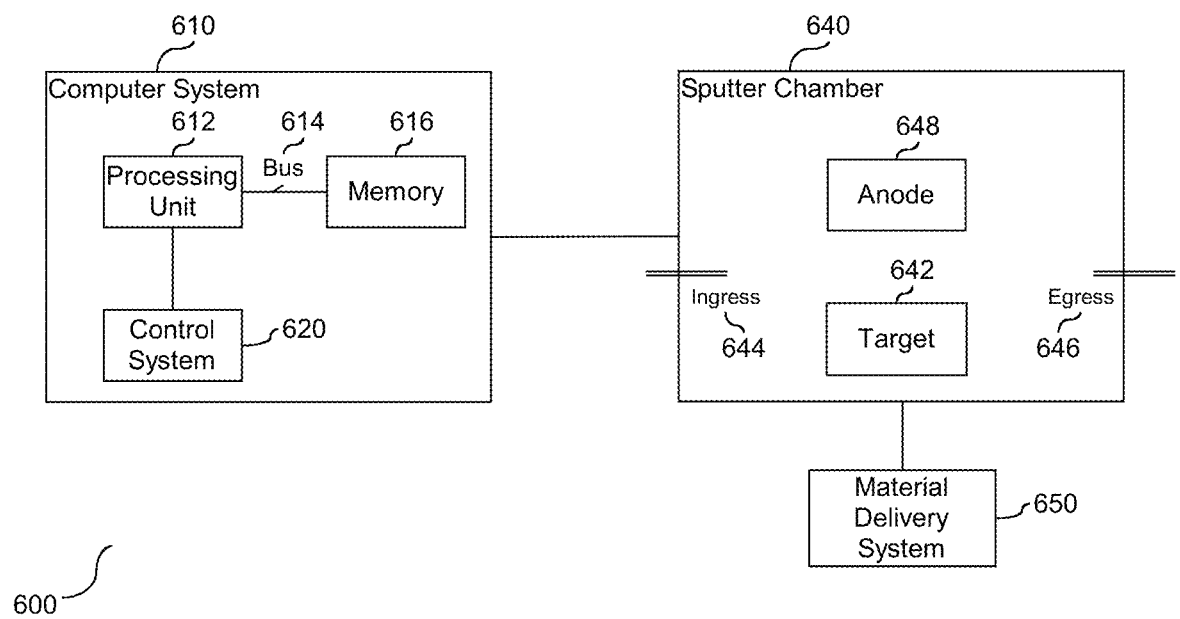
FIG. 6 depicts a block diagram illustrating a computer system in communication with a sputter chamber.

It is understood that the control system may be computer controlled. More specifically, program code may be employed to communicate with the addressable control mechanism of each secondary material. Referring to FIG. 6, a block diagram (600) is provided depicting a computer system in communication with a sputter chamber. As shown, the computer system (610) is provided with a processing unit (612) in communication with memory (616) across a bus (614). A control system (620) is shown in communication with the processing unit (612). Furthermore, a sputter chamber (640) is shown in communication with the computer system (610), and specifically, the processing unit (612). The sputter chamber (640) is shown with a target substrate (642). The sputter chamber (640) is also shown with an anode (648), which is described in detail in FIGS. 1-5. As further shown and described, the sputter chamber (640) includes an ingress (644) for delivery of a sputter gas and an egress (646) for removal of the sputter gas following the interaction of the gas to the target material.

The sputter chamber (640) is shown in communication with a secondary material delivery system (650), which is also in communication with the control system (620). The delivery system (650) is shown with secondary materials to be delivered into the sputter machine and a control mechanism for each unit of secondary material that is available for delivery. More specifically, the delivery system (650) is shown and described in FIGS. 3 and 4 with multiple segments of a first material, with each segment of secondary material having a separately addressable control mechanism, and multiple segments of a secondary material, with each segment having a separately addressable control mechanism. In one embodiment, the secondary materials are aligned so that selection of all of the segments of one of the materials may cover the entire surface area of the target substrate (642). The control system (620) communicates with the addressable control mechanisms of the material delivery system (650) to selectively deliver different selections of the secondary materials to the chamber (640). In one embodiment, the processing unit (612) computes an estimate of the alloy composition at the target substrate (642), and communicates the estimate to the control system (620) to manage the delivery of the select secondary materials. Similarly, in one embodiment, the processing unit (612) computes an estimate of the composition of the alloy film to be produced, and calculates an associated composition of the target, including the quantity and position of secondary materials to be delivered to the target. The calculation is delivered to the control system (620), which communicates with the material delivery system (630) to manage delivery of secondary material(s) to the target.

The method(s) and tool(s) for optimization of the alloy film is shown and described in FIGS. 1-5 and FIG. 6, respectively. More specifically, as shown in FIG. 6, the method of manufacturing the alloy film described above in FIG. 1 has been labeled with tools in the form a control system (620) in communication with the material delivery system (650), referred to herein as tools. The tools may be implemented in programmable hardware devices such as field programmable gate arrays, programmable array logic, programmable logic devices, or the like. The tools may also be implemented in software for execution by various types of processors. An identified functional unit of executable code may, for instance, comprise one or more physical or logical blocks of computer instructions which may, for instance, be organized as an object, procedure, function, or other construct. Nevertheless, the executable of the tools need not be physically located together, but may comprise disparate instructions stored in different locations which, when joined logically together, comprise the tools and achieve the stated purpose of the tool.

Indeed, executable code could be a single instruction, or many instructions, and may even be distributed over several different code segments, among different applications, and across several memory devices. Similarly, operational data may be identified and illustrated herein within the tool, and may be embodied in any suitable form and organized within any suitable type of data structure. The operational data may be collected as a single data set, or may be distributed over different locations including over different storage devices, and may exist, at least partially, as electronic signals on a system or network.

Furthermore, the described features, structures, or characteristics may be combined in any suitable manner in one or more embodiments. In the following description, numerous specific details are provided, such as examples of agents, to provide a thorough understanding of the embodiments. One skilled in the relevant art will recognize, however, that the embodiments can be practiced without one or more of the specific details, or with other methods, components, materials, etc. In other instances, well-known structures, materials, or operations are not shown or described in detail to avoid obscuring aspects of the embodiment(s).

Figure 7:
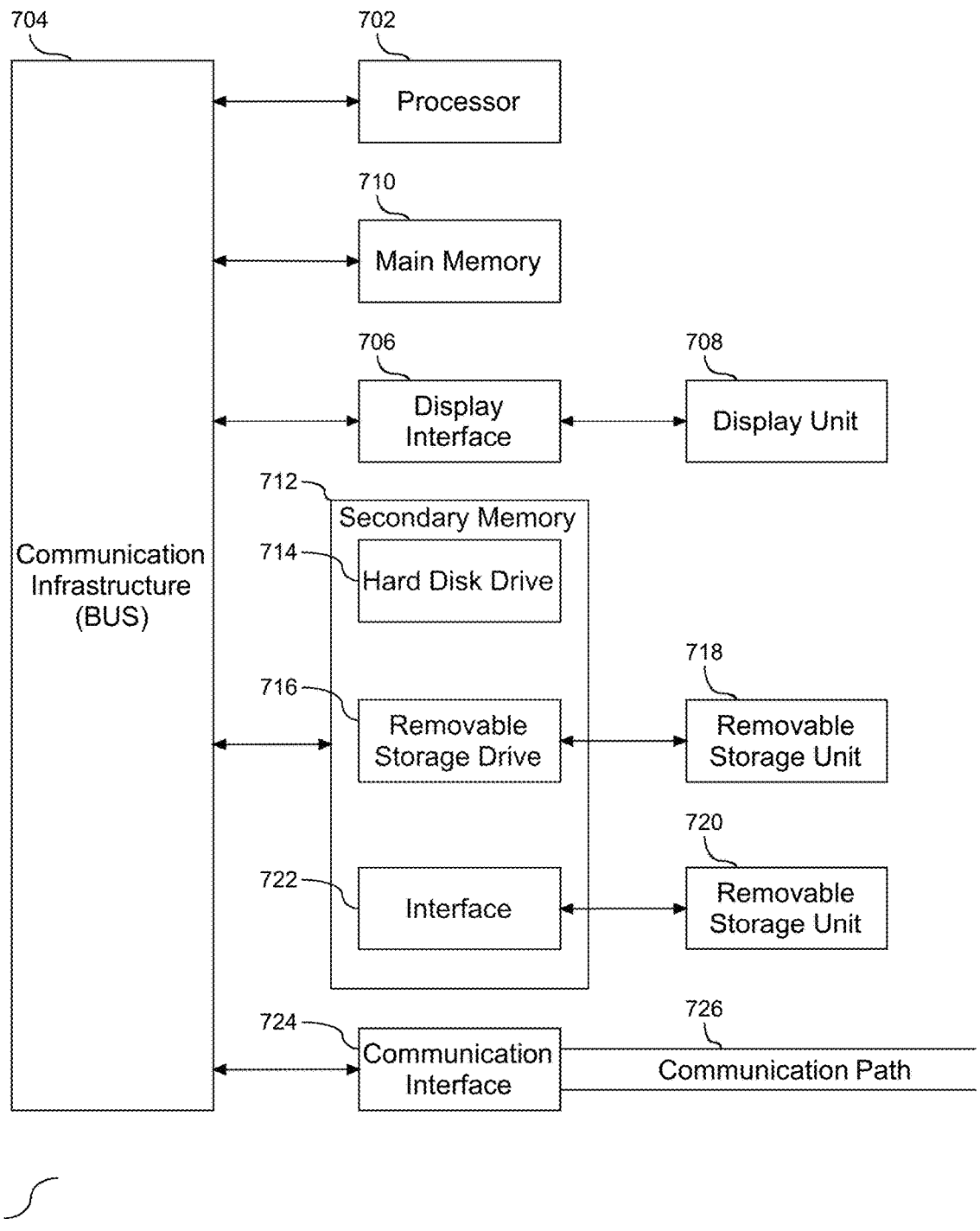
FIG. 7 depicts a block diagram illustrating components of a computer implemented system to support assembly construction and implementation.

Referring now to the block diagram of FIG. 7, additional details are now described with respect to implementing one or more embodiments. The computer system includes one or more processors, such as a processor (702). The processor (702) is connected to a communication infrastructure (704) (e.g., a communications bus, cross-over bar, or network).

The computer system can include a display interface (706) that forwards graphics, text, and other data from the communication infrastructure (704) (or from a frame buffer not shown) for display on a display unit (708). The computer system also includes a main memory (710), preferably random access memory (RAM), and may also include a secondary memory (712). The secondary memory (712) may include, for example, a hard disk drive (714) and/or a removable storage drive (716), representing, for example, a floppy disk drive, a magnetic tape drive, or an optical disk drive. The removable storage drive (716) reads from and/or writes to a removable storage unit (718) in a manner well known to those having ordinary skill in the art. Removable storage unit (718) represents, for example, a floppy disk, a compact disc, a magnetic tape, or an optical disk, etc., which is read by and written to by removable storage drive (716).

In alternative embodiments, the secondary memory (712) may include other similar means for allowing computer programs or other instructions to be loaded into the computer system. Such means may include, for example, a removable storage unit (720) and an interface (722). Examples of such means may include a program package and package interface (such as that found in video game devices), a removable memory chip (such as an EPROM, or PROM) and associated socket, and other removable storage units (720) and interfaces (722) which allow software and data to be transferred from the removable storage unit (720) to the computer system.

The computer system may also include a communications interface (724). Communications interface (724) allows software and data to be transferred between the computer system and external devices. Examples of communications interface (724) may include a modem, a network interface (such as an Ethernet card), a communications port, or a PCMCIA slot and card, etc. Software and data transferred via communications interface (724) is in the form of signals which may be, for example, electronic, electromagnetic, optical, or other signals capable of being received by communications interface (724). These signals are provided to communications interface (724) via a communications path (i.e., channel) (726). This communications path (726) carries signals and may be implemented using wire or cable, fiber optics, a phone line, a cellular phone link, a radio frequency (RF) link, and/or other communication channels.

In this document, the terms "computer program medium," "computer usable medium," and "computer readable medium" are used to generally refer to media such as main memory (710) and secondary memory (712), removable storage drive (716), and a hard disk installed in hard disk drive (714).

Computer programs (also called computer control logic) are stored in main memory (710) and/or secondary memory (712). Computer programs may also be received via a communication interface (724). Such computer programs, when run, enable the computer system to perform the features as discussed herein. In particular, the computer programs, when run, enable the processor (702) to perform the features of the computer system. Accordingly, such computer programs represent controllers of the computer system.

The present embodiment(s) may be a system, a method, and/or a computer program product. The computer program product may include a computer readable storage medium (or media) having computer readable program instructions thereon for causing a processor to carry out aspects of the present embodiment(s).

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present embodiment(s) may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present embodiment(s).

Aspects of the present embodiment(s) are described herein with reference to flowchart illustrations and/or block diagrams of methods, apparatus (systems), and computer program products according to the embodiments. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present embodiment(s) has been presented for purposes of illustration and description, but is not intended to be exhaustive or limited to the embodiment(s) in the form disclosed. Many modifications and variations will be apparent to those of ordinary skill in the art without departing from the scope and spirit of the embodiment(s). The embodiment(s) was chosen and described in order to best explain the principles and the practical application, and to enable others of ordinary skill in the art to understand the various embodiments with various modifications as are suited to the particular use contemplated. The implementation of the introduction of one or more secondary materials into the chamber optimizes the alloy film produced via the reaction with the gas. Accordingly, the delivery of the secondary material is managed and controlled to flexibly change the in-situ coverage of the sputter target surface.

It will be appreciated that, although specific embodiments have been described herein for purposes of illustration, various modifications may be made without departing from the spirit and scope of the embodiments. Accordingly, the scope of protection is limited only by the following claims and their equivalents.

What is claimed is:

1. A computer implemented method for preparing an alloy film, the method comprising a computer readable storage device having program code embodied therewith, the program code executable by a processing unit to:
    communicate with a sputter chamber having a configurable surface in communication with a target material, the configurable surface having a moveable segment;
    flexibly change a composition of the configurable surface, including selectively introduce the segment; and
    introduce ingress gas to interact with the changed composition, the interaction to produce an alloy film.

2. The computer implemented method of claim 1, wherein the program code associated with the composition change deposits a material layer with a gradient alloy composition.

3. The computer implemented method of claim 2, further comprising program code to control the segment as a percentage of surface coverage of the target surface.

4. The computer implemented method of claim 3, wherein the segment has an addressable control mechanism, and further comprising program code to communicate with a segment address.

5. The computer implemented method of claim 1, wherein the film has a flexible vertical gradient, and further comprising program code to change the gradient based on a composition of the configurable surface.

6. The computer implemented method of claim 1, wherein the program code to flexibly change the composition further comprises program code to estimate a gradient composition from a sputter rate of the segment.

7. The computer implemented method of claim 1, wherein selective introduction of the segment includes program code to change a proportion of the segment with respect to the chamber.

8. The computer implemented method of claim 1, wherein the program code to flexibly change the composition further comprises program code to selectively introduce a second segment.

9. The computer implemented method of claim 8, wherein the first segment comprises a first material and the second segment comprises a second material different from the first material.

10. The computer implemented method of claim 1, wherein the target material comprises Copper and the segment comprises a material selected from the group consisting of: Gallium and Indium.

11. The computer implemented method of claim 1, wherein the selective introduction of the segment includes program code to change in-situ coverage of the target.

12. A computer system comprising:
    a processing unit operatively coupled to memory;
    a sputter chamber in communication with the processing unit, the chamber having a configurable surface in communication with a target material, the configurable surface having a moveable segment;
    a control system in communication with the sputter chamber, the control system to prepare an alloy film;
    the control system to change a composition of the configurable surface, including selective introduction of the segment; and
    ingress gas introduced to interact with the changed composition, the interaction to produce the alloy film.

13. The system of claim 12, further comprising the composition change of the configurable surface deposits a material layer with a gradient alloy composition.

14. The system of claim 13, further the control system to control the selective introduction of the segment as a percentage of surface coverage of the target surface.

15. The system of claim 14, wherein the segment has an addressable control mechanism, and further comprising the control system to communication with a segment address.

16. The system of claim 12, wherein the film has a flexible vertical gradient, and further comprising the control system to change the gradient based on a composition of the configurable surface.

17. The system of claim 12, further comprising the control system to estimate a gradient composition from a sputter rate of the segment.

18. The system of claim 12, wherein selective introduction of the segment includes program code to change a proportion of the segment with respect to the chamber.

19. The system of claim 12, further comprising the control system to selectively introduce a second segment.

20. The system of claim 19, wherein the second segment comprises a second material different from the first segment.

* * * * *